United States Patent
Park et al.

(10) Patent No.: US 7,135,865 B2
(45) Date of Patent: Nov. 14, 2006

(54) NUCLEAR MAGNETIC RESONANCE SPECTROMETER AND METHOD FOR OPERATION THEREOF

(75) Inventors: Minseok Park, Hitachinaka (JP); Hiroshi Morita, Mito (JP); Hideta Habara, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/059,372

(22) Filed: Feb. 17, 2005

(65) Prior Publication Data

US 2005/0206383 A1  Sep. 22, 2005

(30) Foreign Application Priority Data

Mar. 22, 2004 (JP) ............................. 2004-082533

(51) Int. Cl.
 *G01V 3/00* (2006.01)
(52) U.S. Cl. ...................................... 324/321; 324/300
(58) Field of Classification Search ................ 324/321, 324/322, 318, 300, 308, 305, 319, 309, 307; 600/410, 419, 422
 See application file for complete search history.

(56) References Cited

U.S. PATENT DOCUMENTS

| | | | | |
|---|---|---|---|---|
| 4,549,136 A | * | 10/1985 | Zens | 324/308 |
| 5,258,712 A | * | 11/1993 | Hofmann et al. | 324/318 |
| 5,302,900 A | * | 4/1994 | Cummings | 324/321 |
| 5,867,026 A | * | 2/1999 | Haner | 324/321 |
| 6,177,798 B1 | * | 1/2001 | Haner et al. | 324/321 |
| 6,686,740 B1 | * | 2/2004 | Tschirky et al. | 324/321 |

FOREIGN PATENT DOCUMENTS

| | | |
|---|---|---|
| JP | 5-249214 | 9/1993 |
| JP | 6-249934 | 9/1994 |
| JP | 7-84023 | 3/1995 |

OTHER PUBLICATIONS

W.F. Reynolds, M. Yu, R.G. Enriquez, "Investigating the Sensitivity Limits of the 13C-Detected 1H-13C Chemical Shift Correlation Sequences With Modern Microprobe and Microtube Technology", Magnetic Resonance in Chemistry, vol. 35, 613-618, (1997).

(Continued)

*Primary Examiner*—Brij B. Shrivastav
(74) *Attorney, Agent, or Firm*—Antonelli, Terry, Stout and Kraus, LLP.

(57) ABSTRACT

There is providesd a nuclear magnetic resonance spectrometer having a high sensitiveness by simultaneously realizing a high uniformity of a static magnetic field and a high measuring sensitiveness. A sample tube used in the nuclear magnetic resonance spectrometer is constructed in a structure in which the shape of a sample placed in a measuring space can be changed. The change in shape of the sample can be achieved by controlling the pressure applied to the sample. There is at least one surface of contact between the sample placed in the measuring space and a gas existing around the sample, and the shape of such surface is maintained by the surface tension of the sample. In this case, a central portion of a magnet, into which the sample tube is inserted, filled with a sterilizing gas having a pressure higher than the atmospheric pressure, and the sample having a surface of contact with the gas is maintained in a sterile state. A measuring coil used in the nuclear magnetic resonance spectrometer is disposed on a rotatable curved surface symmetrical with respect to a rotational axis provided by a longitudinal center axis of the sample tube.

17 Claims, 6 Drawing Sheets

OTHER PUBLICATIONS

L.D. Landau and E.M. Lifshitz, "Fluid Mechanics," 2nd English Edition, (Pergamon, 1986).

C. Pozrikidis, "Introduction to Theoretical and Computational Fluid Dynamics", Oxford University Press, New York, 1997.

* cited by examiner

NUCLEAR MAGNETIC RESONANCE SPECTROMETER AND METHOD FOR OPERATION THEREOF

BACKGROUND OF THE INVENTION

1. Field of the Invention

The present invention relates to a nuclear magnetic resonance spectrometer using a sample tube for a sample whose shape is deformable, and a method for operation thereof.

2. Description of the Related Art

The shapes of a sample tube and a detection coil in a nuclear magnetic resonance spectrometer (which will be referred to as a NMR system hereinafter) as shown in FIG. 2 are well-known. For example, a sample tube shown in FIG. 2 in JP-A-06-249934 has a shape similar to that of a common test tube, and in measuring thereof, the sample tube is inserted into a central portion of a NMR magnet adapted to generate an intense static magnetic field.

A housing 12 of a detecting device (probe) and a measuring coil 14 are disposed around the inserted sample tube 10 to surround the sample tube 10. A gas 15 is also present between the sample tube 10 and the housing 12 of the detecting device. In general, a sample solution 18, the sample tube 10 and the gas 16 are different in magnetic permeability from one another, and hence, a boundary surface perpendicular to the static magnetic field is magnetized to disturb the static magnetic field around the boundary surface.

For example, when the static magnetic field generated by the magnet faces in an axial direction of the sample tube 3, the static magnetic field is disturbed at vertically opposite ends of the sample solution 18 and the sample solution 20, i.e., at portions outside the boundary. In order to reduce the adverse affection exerted to an NMR spectrum by the disturbance of the static magnetic field, only a signal transmitted from a sample portion 18 of the sample solutions 18 and 20 filling the sample tube 10, which is present at a central portion where the static magnetic field is not disturbed, is detected by the measuring coil 14. The signal emitted from that portion of the sample solution 20 exists outside a space surrounded by the coil 14 and cannot reach the measuring coil 14, because of a low sensitiveness of the measuring coil 14.

In the system shown in FIG. 2 and described in JP-A-06-249934, the uniformity of the static magnetic field is poor, and in order to prevent the degradation of the NMR spectrum due to the disturbance of the static magnetic field, a surplus sample 20 to be measured is required in addition to the sample solution 18 to be measured, which makes it difficult to analyze a very small amount of a sample. In order to improve the problem associated with JP-A-06-249934, JP-A-05-249214 has been proposed. A system described in this JP-A-05-249214 includes a spherical (in general, elliptic) measuring space into which a sample solution 18 to be measured is placed, and a capillary tube 22 for introduction of a sample solution into the measuring space, as shown in FIG. 3.

According to JP-A-05-249214, the shape of the sample solution is spherical or elliptic, and in the static magnetic field which is uniform spatially, the static magnetic field in the sample solution can be uniformized irrespective of the sample solution 18 and the magnetic permeability of the sample tube 10 and the peripheral gas 16. This is because a difference in permeability between inside and outside the ellipse disturbs the magnetic field around the sample solution 18, but does not disturb the internal magnetic field in the sample solution 18, according to an electro-magnetological law. Therefore, in the system described in JP-A-05-249214, the uniformity of the static magnetic field can be enhanced by forming the sample solution into the elliptic shape. However, as can be seen from the geometrical dispositions of the sample tube 10 and the measuring coil 14 as shown in FIG. 3, the distance between the measuring coil 14 and the sample solution 18 is larger, and the measuring sensitivity is lower.

SUMMARY OF THE INVENTION

Accordingly, it is an object of the present invention to provide an NMR system having a high sensitiveness by simultaneously realizing a high uniformity of a static magnetic field and a high measuring sensitiveness.

To achieve the above object, according to the present invention, there is provided a nuclear magnetic resonance spectrometer, comprising a probe having an elliptic or spherical measuring space, a sample tube having a capillary tube extending into the measuring space through an insertion opening provided in the probe, a signal-detecting coil disposed along an elliptic or spherical portion of said probe outside the measuring space, wherein a sample is pushed into the measuring space through the capillary tube and maintained in an elliptic or spherical shape in the measuring space by a surface tension of the sample.

With the above arrangement, by deforming the sample into an elliptic shape after insertion of the sample into the measuring coil, the sample can be positioned in the space in which the static magnetic field created by a magnet is more uniform, and the disturbance of the static magnetic field due to the sample can be prevented. Thus, the uniformity of the static magnetic field applied to the sample can be enhanced, thereby providing an NMR spectrum having a high resolution and a high sensitiveness.

Other objects, features and advantages of the invention will become apparent from the following description of the embodiments of the invention taken in conjunction with the accompanying drawings.

DETAILED DESCRIPTION OF THE INVENTION

Figure 1:
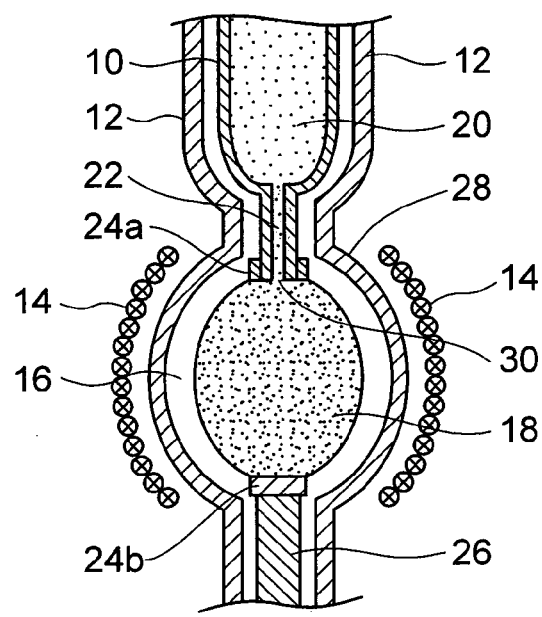
FIG. 1 is a sectional plan view of a sample tube and a measuring coil according to the present invention.
Figure 2:
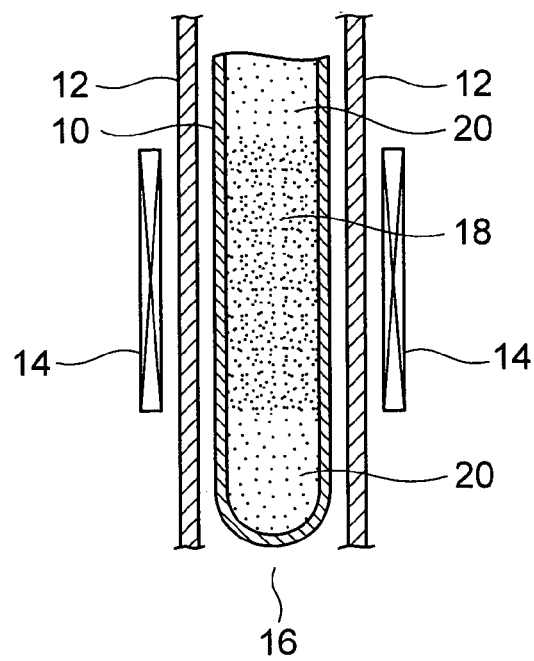
FIG. 2 is a sectional plan view of a sample tube and a measuring coil described in JP-A-06-249934.
Figure 3:
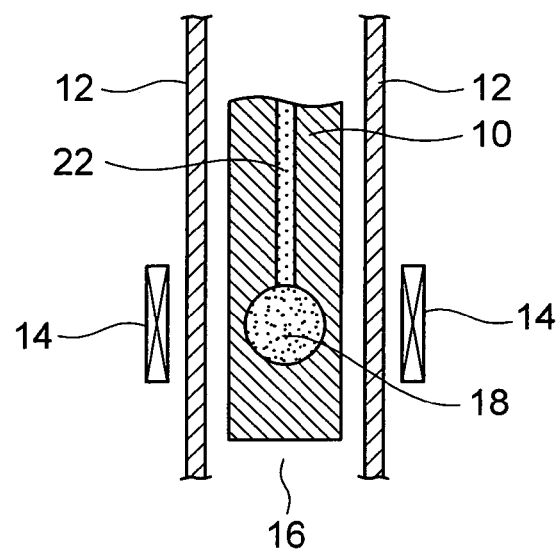
FIG. 3 is a sectional plan view of a sample tube and a measuring coil described in JP-A-05-249214.

The present invention has been accomplished by attaining an object for simultaneously realizing a high uniformity of static magnetic field and a high measuring sensitiveness by changing the shape of a sample after insertion of the sample into a measuring coil. FIG. 1 shows a sample tube for NMR and a measuring coil according to one embodiment of the present invention.

A sample tube body 10 for containing a sample 18 to be measured and a non-measured sample 20 has a capillary tube 22 at its lower portion. A support plate 24a is provided around an outer periphery of an opening of the capillary tube 22. A support plate 24b is mounted in an opposed relation to the support plate 24a, so that the distance between the support plates 24a and 24b can be regulated by vertically moving a support shaft 26 supporting the support plate 24b. Each of the support plates 24a and 24b is made of a material having a small wettability to the sample 18.

The sample 18 to be measured is pushed out of a lower portion of the capillary tube 22 and brought into direct contact with a peripheral gas 16. The shape of the contact surface of the sample 18 is maintained by the surface tension of the sample 18, as will be described hereinafter. The peripheral gas 16 is a sterilizing gas having a pressure higher than the atmospheric pressure. The face of the sample 18 which is not in contact with the peripheral gas 16 is in contact with the two support plates 24a and 24b. The shape and volume of the sample 18 to be measured can be controlled by changing the distance between the support plates 24a and 24b.

The sample tube body 10 and the capillary tube 22, the support plates 24a and 24b mounted in the opposed relation to each other and the support shaft 26 are contained within a probe container 12. The probe container 12 has a spherical portion 28, within which the sample 18 pushed out of the capillary tube 22 is formed into a spherical elliptic shape by the surface tension.

One 24a of the two support plates 24a and 24b, which is located at a tip end of the sample tube body 10, has a single hole 30 or a plurality of holes 30 connected to the capillary tube 22. The capillary tube 22 acts as a passage connecting the sample to be measured 18 and the non-measured 20 contained in the sample tube body 10 to each other.

The support plate 24b spaced apart from the sample tube body 10 is coupled to the support shaft 26 and used to control the shape and volume of the sample 18 to be measured. The support shaft 26 is vertically movably supported.

The probe 12 is disposed to surround the sample 18 to be measured and the peripheral gas 16, and a space within the probe, in which the measuring coil 14 and other electric circuits are actually mounted, is protected from the entrance of the sample and the gas. The measuring coil 14 is disposed on a rotatable curved surface symmetrical with respect to a rotational axis provided by a longitudinal center axis of the sample tube body 10. The measuring coil 14 is also mounted along outside the spherical portion of the probe 12 and hence, in order to ensure that the measuring coil 14 extends along the contour of the sample 18 formed into the spherical shape, the distance between the measuring coil 14 and the surface of the sample 18 is substantially uniform and small.

Figure 4:
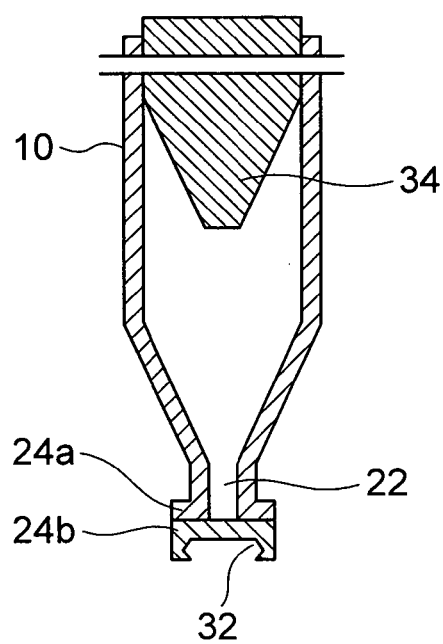
FIG. 4 is a sectional plan view of the sample tube according to the present invention.

As shown in detail in FIG. 4, the sample tube body 10 is thinner at its tip end provided with the capillary tube 22, and the sample support plate 24a formed into a collar shape is mounted at a tip end of the capillary tube 22. The support plate 24b opposed to the support plate 24a is capable of being brought into contact with the support plate 24a so as to close a hole 8c in the support plate 24a connected to the capillary tube 22. A groove 32 of a nut for connection with the support shaft 26 is formed in a face of the support plate 24b opposite from a face coupled to the support plate 24a. The control of the internal pressure in the sample tube 10 is carried out by controlling the movement of a piston 34 mounted within the sample tube 10.

Figure 5:
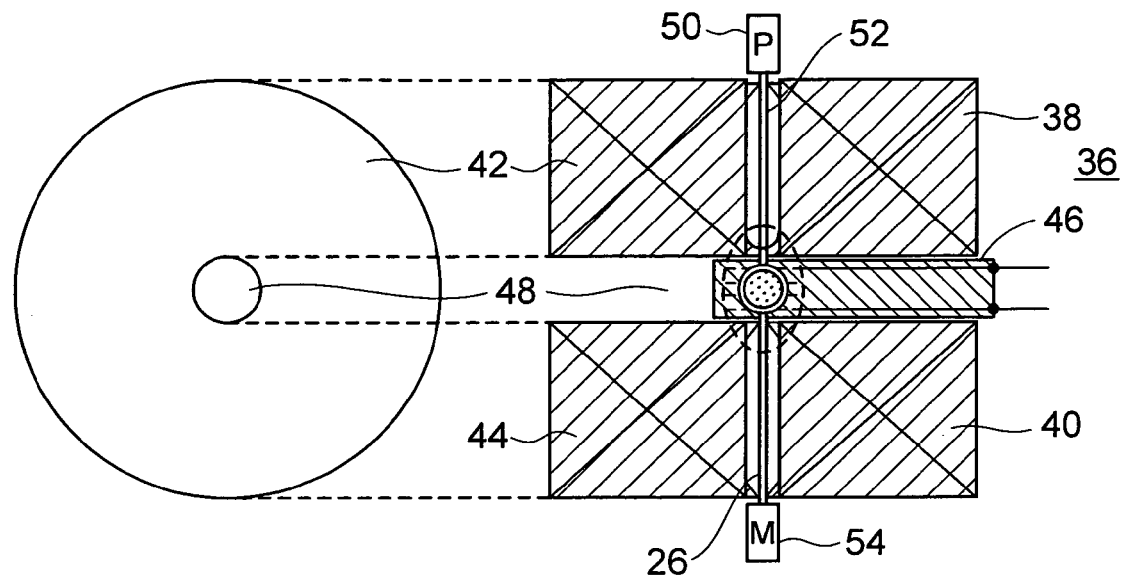
FIG. 5 is a sectional plan view of a portion of an NMR system to which the present invention is applied.

FIG. 5 shows an embodiment of the present invention applied to an NMR system using a split-type magnet. In the split-type magnet, a magnet 36 is comprised of two or more separated magnet units 38, 40, 42 and 44. A probe 46 is inserted into a bore 48 provided in a central portion of the magnet 36, and a pressure transmitting pipe 52 connected to a pressure controller 50 and a support shaft 26 connected to a support shaft position controller 54 are connected to a tip end of the probe 46.

Figure 6:
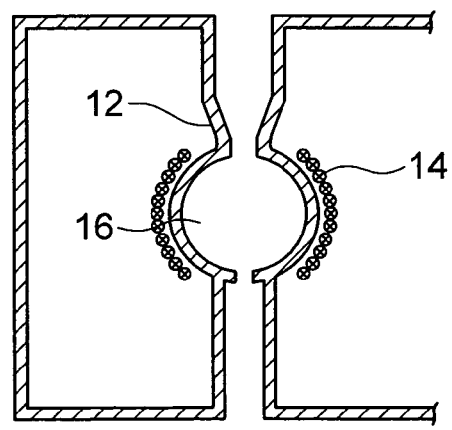
FIG. 6 is a sectional plan view of a tip end of a probe including the sample tube and the measuring coil according to the present invention mounted therein.

FIG. 6 shows a sample insertion bore and a measuring coil at the tip end of the probe. The split-type magnet is shown in FIG. 5, but a solenoid-type magnet is used in this embodiment. FIG. 5 shows the probe having a sample insertion bore perpendicular to an axis of a probe housing, but a probe having a sample insertion bore parallel to an axis of probe housing is used in this embodiment.

FIGS. 7A to 7D are flow diagrams for explaining operations when a sample tube according to the present invention is used for NMR measurement. FIGS. 7A to 7D correspond to steps A to D shown in FIG. 7E, respectively. When the sample tube 3 is inserted from above, the support plate 24a located at a tip end of the sample tube 3 is stopped at a location corresponding to an inlet of a hole formed at one end of a spherical or elliptic space (step A and FIG. 7A).

When the sample tube 3 has been stopped, the support shaft 26 is raised, whereby the support plate 24b is brought into contact with and coupled to the support plate 24a. In this case, the movement of the support shaft 26 is controlled by the support shaft position controller 54 shown in FIG. 5 (step B and FIG. 7B). When the coupling of the support plate 24b to the support plate 24a has been completed, the pressure controller 12 shown in FIG. 5 lowers the piston 18 shown in FIG. 4 through the pressure transmitting pipe 13 to increase the internal pressure in the non-measured sample 20 located in the sample tube body 10.

At the same time, the support shaft 26 is lowered. The increase in internal pressure and the lowering of the support shaft 26 cause the support plate 24b to be moved away from the support plate 24a, whereby the sample 18 to be measured emerges from the capillary tube 22 between the support plates 24a and 24b (step C and FIG. 7C). When the volume of the sample 18 to be measured reaches a target value, the pressure in the sample tube and the position of the support shaft 26 are kept constant, and the measurement is started (step D and FIG. 7D).

Figure 7A:
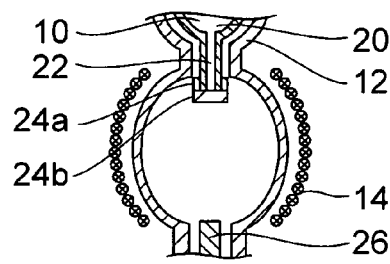
FIGS. 7A to 7E are flow diagrams showing operations carried out using the sample tube according to the present invention.
Figure 7B:
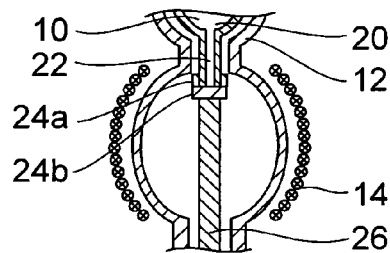
Figure 7C:
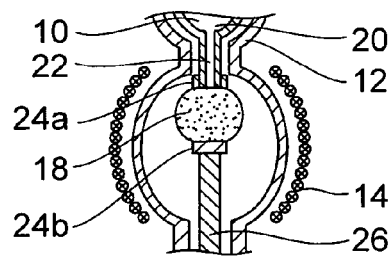
Figure 7D:
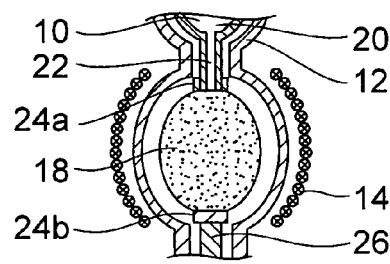
Figure 7E:
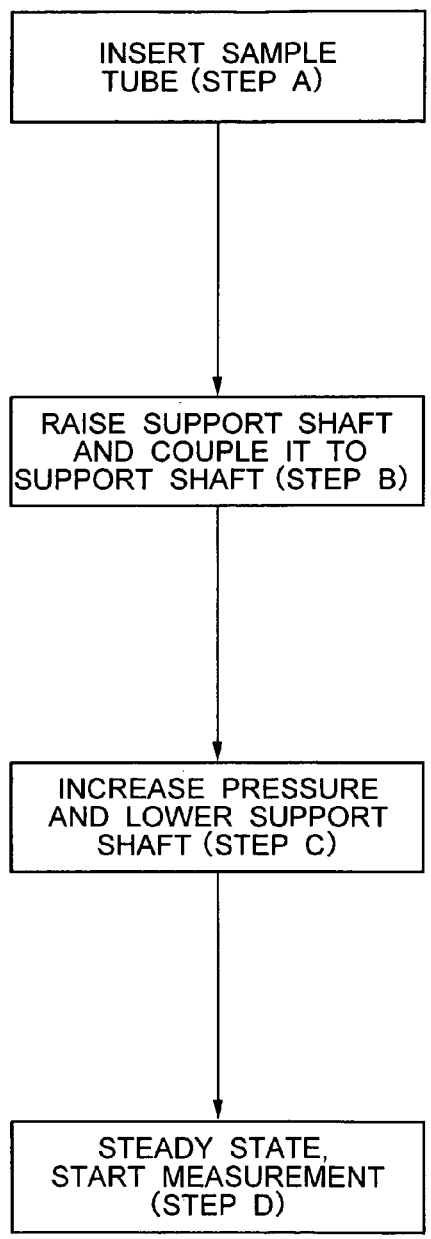

The shape of the contact face between the sample 18 to be measured and the peripheral gas 16 at the steps C and D in FIG. 7E, if no force other than the surface tension is applied, is determined according to the following Laplace formulae (1) and (2):

$$P_1 - P_2 = \alpha\left(\frac{1}{R_1} + \frac{1}{R_2}\right) \quad (1)$$

$$\Delta P = P_1 - P_2 \quad (2)$$

which are referred to the document, L. D. Landau and E. M. Lifshitz, "FLUID MECHANICS", 2nd English Edition (Pergamon, 1986).

In the above formulae, $P_1$ and $P_2$ are internal pressures in the sample 18 to be measured and the peripheral gas 16, respectively; $\alpha$ is a coefficient of surface pressure; and $\Delta P$ represents a difference in pressure on the contact surface. To ensure that the contact surface is stable, it is a necessary and sufficient that $\Delta P$ has the same value at all points on the contact surface.

In addition, $R_1$ and $R_2$ are a magnitude called a principal radii of curvature in geometry, and $(1/R_1 + 1/R_2)$ is defined as a mean curvature and used to describe the shape of a three-dimensional curved surface. According to a differential geometry, when all points (x, y, z) on the three-dimensional curved surface satisfy an equation, F(x, y, z))=0, the mean curvature is represented by the following equation (3):

$$\frac{1}{2}\left(\frac{1}{R_1} + \frac{1}{R_2}\right) = \frac{1}{2}\nabla\cdot\left(\frac{\nabla F}{|\nabla F|}\right) \quad (3)$$
$$= \frac{1}{2}\frac{1}{|\nabla F|^3}[|\nabla F|^3 \nabla^2 F - \nabla F \cdot (\nabla \nabla F)\cdot \nabla F]$$

If the equation (3) is replaced into the equation (1), an equation (4) is provided, and a function F(x, y, z) representing the stable shape of the contact surface can be determined by the internal pressures $P_1$ and $P_2$ and the coefficient $\alpha$ of surface tension (for example, see Document: C. Pozrikidis, "Introduction to Theoretical and Computational Fluid Dynamics", Oxford University Press, New York, 1997).

$$P_1 - P_2 = \frac{\alpha}{|\nabla F|^3}[|\nabla F|^3 \nabla^2 F - \nabla F \cdot (\nabla \nabla F)\cdot \nabla F] \quad (4)$$

If the presence of a force other than the surface tension must be taken into consideration, then it is added as another term to a right side of the equation (4). For example, if the influence of the force of gravity applied in a z-direction is taken into consideration, the equation is changed to the following equation:

$$P_1 - P_2 = \frac{\alpha}{|\nabla F|^3}[|\nabla F|^3 \nabla^2 F - \nabla F \cdot (\nabla \nabla F)\cdot \nabla F] + g(\rho_1 - \rho_2)z \quad (5)$$

Figure 8:
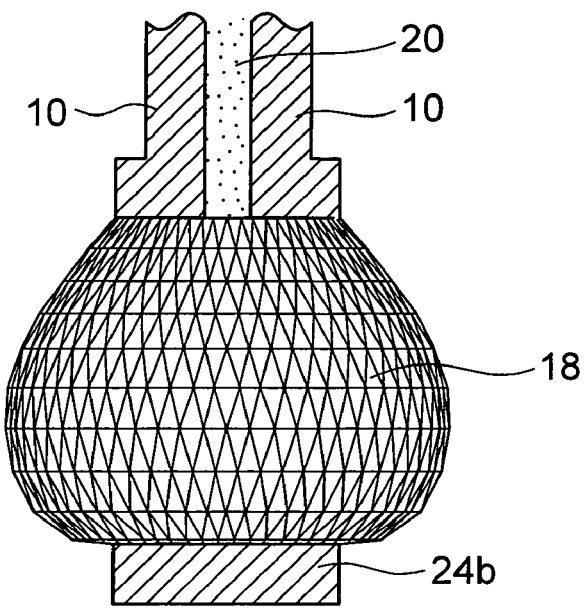
FIG. 8 is a plan view of the shapes of a portion of the sample tube according to the present invention and a sample to be measured.

In the equation (5), g, $\rho_1$ and $\rho_2$ are a gravitational acceleration constant, a density of the sample 18 and a density of the peripheral gas 16, respectively. One example of a shape of the sample to be measured 18 determined by the surface tension and the force of gravity given in equation (5) is shown in FIG. 8.

In the equation (5), $P_1$ is a pressure of the sample to be measured 18 shown in FIG. 1. According to Pascal's principle, the pressure of the sample 18 to be measured is equal in a steady state to the pressure of the non-measured sample 20 connected to the capillary tube 22 and can be controlled easily by regulating the pressure of the non-measured sample 20.

In contrast to this case, g, $\rho_1$, $\rho_2$ and $\alpha$ are determined by a place where the NMR measurement is carried out and the sample and gas used. Therefore, a range capable of being selected for each of g, $\rho_1$, $\rho_2$ and $\alpha$ is very narrow, and it is difficult to use them as common control factors. The pressure P2 of the peripheral gas 16 is not appropriate as a control factor, because of the characteristic of the NMR system in which the peripheral gas 16 is always circulated by a tube outside the magnet. Therefore, in the embodiment of the present invention, the shape of the sample 18 to be measured is changed by controlling the pressure applied to the non-measured sample 20.

By constructing the sample tube and the measuring coil of the NMR system as described in the above-described first embodiment, the shape of the sample can be changed to an elliptic shape after insertion of the sample into the measuring coil. Further, the sample is positioned in a more uniform space by the static magnetic field created by the magnet, and the uniformity of the static magnetic field applied to the sample is enhanced by preventing the disturbance of the static magnetic field due to the sample, leading to improvements in resolution and sensitiveness of an NMR spectrum. In addition, the measuring coil can be disposed along the surface of the ellipse without prolongation of the distance between the sample and the measuring coil, leading to a further enhancement in measuring sensitiveness.

Figure 9:
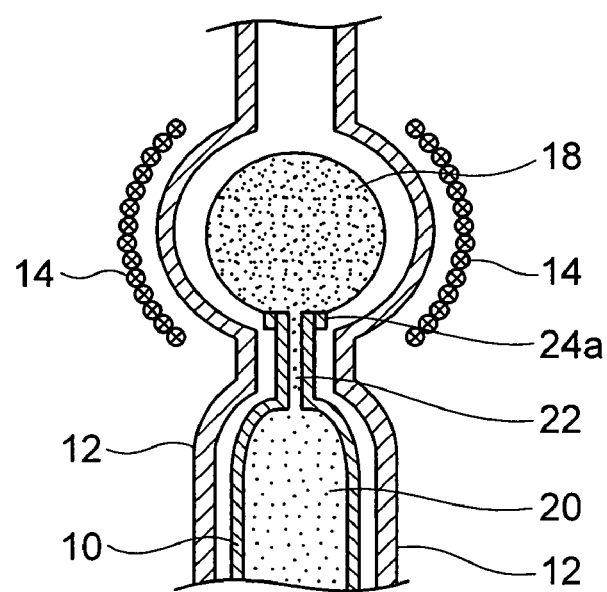
FIG. 9 is a plan view of a sample tube and a measuring coil according to another embodiment of the present invention in section.

FIG. 9 shows another embodiment of the present invention. In this embodiment, a sample 18 to be measured is placed in contact with a support plate 24a which is connected to a capillary tube 22 provided at a tip end of a sample tube body 10. FIG. 9 shows an example in which the sample 18 to be measured is positioned above the support plate 24a, but the support plate 24a may be disposed above the sample 19 to be measured, or may be at another location. Other portions and components shown in FIG. 9 are similar to those in the first embodiment and hence, the description of them is omitted.

In the second embodiment, a support plate 24b and a support shaft 26 connected to the support plate 24b as well as a support shaft position controller 14 are eliminated and hence, the arrangement and operation are simple, as compared with those in the first embodiment. Therefore, if a sample tube and a measuring coil of the NMR system are constructed as in the second embodiment, the same effect as in the first embodiment can be likewise obtained in the simple arrangement. In addition, an upper portion of a housing 12 is opened and hence, it is possible to project light or a laser beam for the measurement and to insert a pipette.

However, the arrangement in the second embodiment includes no support plate 24b and hence, the volume of the sample 18 to be measured whose shape can be maintained stably is decreased as compared with that in the first embodiment, and the intensity of a signal measured is decreased in accordance with the decrease in volume of the sample to be measured.

Figure 10:
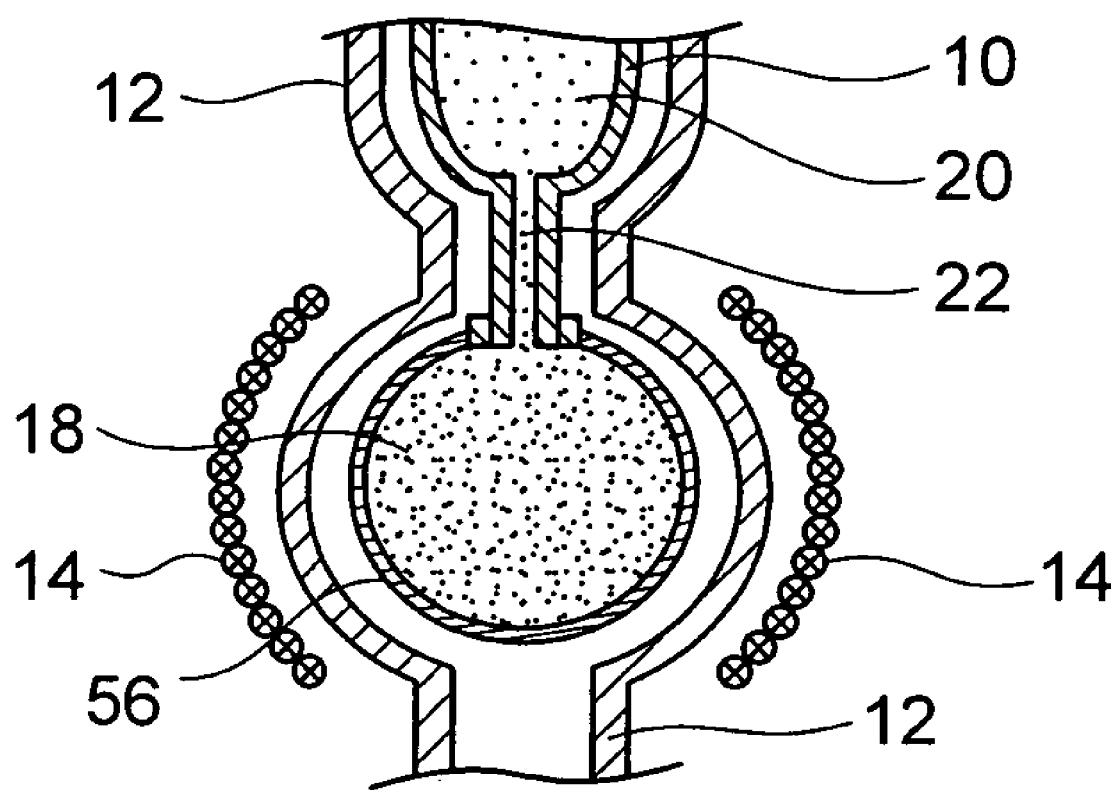
FIG. 10 is a sectional plan view of a sample tube and a measuring coil according to a further embodiment of the present invention.

FIG. 10 shows a further embodiment of the present invention. In this third embodiment, an elastic container 56 made of an elastomeric material containing no hydrogen is disposed between a sample 18 to be measured and a peripheral gas 16, unlike the above-described first and second embodiments. The use of the elastic container 56 of the material containing no hydrogen ensures that the volume of the sample 18 to be measured, whose shape can be maintained stably, can be increased without deterioration of the simplicity of the arrangement and operation of the system in the second embodiment.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A nuclear magnetic resonance spectrometer, comprising a probe having an elliptic or spherical measuring space, a sample tube having a capillary tube extending into said measuring space through an insertion opening provided in said probe, a signal-detecting coil disposed along an elliptic or spherical portion of said probe outside said measuring space and having a shape conforming to the elliptic or spherical portion of said probe, wherein a sample is pushed into the measuring space through the capillary tube and maintained in an elliptic or spherical shape in the measuring space by a surface tension of the sample.

2. A nuclear magnetic resonance spectrometer according to claim 1, further including a first support plate mounted in an outlet of said capillary tube, and a second support plate opposed to said first support plate, said second support plate being supported for movement toward and away from said first support plate, and the distance between said first and second support plates being capable of being regulated.

3. A nuclear magnetic resonance spectrometer according to claim 1, wherein said signal-detecting coil is disposed on a rotatable curved surface symmetrical with respect to a rotational axis provided by a longitudinal center axis of said sample tube.

4. A nuclear magnetic resonance spectrometer according to claim 2, wherein said first and second support plates each have a water repellency.

5. A nuclear magnetic resonance spectrometer according to claim 2, wherein the shape of the sample is changed by controlling the pressure applied to the sample.

6. A nuclear magnetic resonance spectrometer according to claim 2, wherein the sample is maintained in a sterile state by filling the measuring space with a sterilizing gas having a pressure higher than the atmospheric pressure.

7. A nuclear magnetic resonance spectrometer according to claim 2, wherein said signal-detecting coil is disposed on a rotatable curved surface symmetrical with respect to a rotational axis provided by a longitudinal center axis of said sample tube.

8. A nuclear magnetic resonance spectrometer according to claim 1, wherein the signal-detecting coil is configured so as to be spaced a substantially uniform distance from the surface of the sample and has a contour corresponding to a contour of the surface of the sample.

9. A nuclear magnetic resonance spectrometer comprising a probe having an elliptic or spherical measuring space, a sample tube having a capillary tube extending into said measuring space through an insertion opening provided in said probe, a signal-detecting coil disposed along an elliptic or spherical portion of said probe outside said measuring space, wherein a sample is pushed into the measuring space through the capillary tube and maintained in an elliptic or spherical shape in the measuring space by a surface tension of the sample, wherein the shape of the sample is changed by controlling the pressure applied to the sample.

10. A nuclear magnetic resonance spectrometer according to claim 9, further including a first support plate mounted in an outlet of said capillary tube, and a second support plate opposed to said first support plate, said second support plate being supported for movement toward and away from said first support plate, and the distance between said first and second support plates being capable of being regulated.

11. A nuclear magnetic resonance spectrometer, comprising a probe having an elliptic or spherical measuring space, a sample tube having a capillary tube extending into said measuring space through an insertion opening provided in said probe, a signal-detecting coil disposed along an elliptic or spherical portion of said probe outside said measuring space, wherein a sample is pushed into the measuring space through the capillary tube and maintained in an elliptic or spherical shape in the measuring space by a surface tension of the sample, wherein the sample is maintained in a sterile state by filling the measuring space with a sterilizing gas having a pressure higher than the atmospheric pressure.

12. A nuclear magnetic resonance spectrometer according to claim 11, further including a first support plate mounted in an outlet of said capillary tube, and a second support plate opposed to said first support plate, said second support plate being supported for movement toward and away from said first support plate, and the distance between said first and second support plates being capable of being regulated.

13. A nuclear magnetic resonance spectrometer, comprising a probe having an elliptic or spherical measuring space, a sample tube having a capillary tube extending into said measuring space through an insertion opening provided in said probe, a first support plate mounted at an outlet of said capillary tube, a second support plate mounted in an opposed relation to said first support plate, a support shaft which supports said second support plate for movement, and a signal-detecting coil disposed along an elliptic or spherical portion of said probe outside said measuring space, wherein a sample is pushed into the measuring space through the capillary tube and maintained in an elliptic or spherical shape in the measuring space by a surface tension of the sample, and then changed in shape by moving said support shaft.

14. A nuclear magnetic resonance spectrometer according to claim 13, wherein the signal-detecting coil has a shape conforming to the elliptic or spherical portion of said probe is configured so as to be spaced a substantially uniform distance from the surface of the sample and has a contour corresponding to a contour of the surface of the sample.

15. A nuclear magnetic resonance spectrometer according to claim 14, wherein the signal-detecting coil is disposed along an elliptic or spherical portion of said probe outside said measuring space and has a shape conforming to the elliptic or spherical portion of said probe.

16. A method of measuring a nuclear magnetic resonance, comprising the steps of; pushing out a sample into an elliptic or spherical measuring space provided in a probe through a capillary tube; maintaining said sample in an elliptic or spherical shape in said measuring space; applying an electromagnetic wave to said sample; and receiving a signal by a signal-detecting coil disposed along an elliptic or spherical portion of said probe outside said measuring space and having a shape conforming to the elliptic or spherical portion of said probe.

17. A method of measuring a nuclear magnetic resonance according to claim 16, wherein the signal-detecting coil is configured so as to be spaced a substantially uniform distance from the surface of the sample and has a contour corresponding to the contour of the surface of the sample.

* * * * *